(12) United States Patent (10) Patent No.: US 9,252,312 B2
Ishiguro et al. (45) Date of Patent: Feb. 2, 2016

(54) SOLAR CELL MODULE AND MANUFACTURING METHOD THEREFOR

(71) Applicant: Sanyo Electric Co., Ltd., Moriguchi, Osaka (JP)

(72) Inventors: Tasuku Ishiguro, Kobe (JP); Toshiyuki Sakuma, Izumisano (JP); Yukihiro Yoshimine, Kobe (JP); Atsushi Saita, Kobe (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 6 days.

(21) Appl. No.: 13/962,249

(22) Filed: Aug. 8, 2013

(65) Prior Publication Data

US 2013/0319497 A1 Dec. 5, 2013

Related U.S. Application Data

(63) Continuation of application No. PCT/JP2012/054416, filed on Feb. 23, 2012.

(30) Foreign Application Priority Data

Feb. 24, 2011 (JP) .................................. 2011-038147

(51) Int. Cl.
*H01L 31/0203* (2014.01)
*H01L 31/05* (2014.01)
*H01L 31/02* (2006.01)
*H01L 31/048* (2014.01)
*H01L 31/18* (2006.01)

(52) U.S. Cl.
CPC ........ *H01L 31/0508* (2013.01); *H01L 31/0201* (2013.01); *H01L 31/048* (2013.01); *H01L 31/1876* (2013.01); *Y02E 10/50* (2013.01)

(58) Field of Classification Search
CPC .............. H01L 31/0201; H01L 31/048; H01L 31/1876; H01L 31/0508
USPC ......................................................... 136/244
See application file for complete search history.

(56) References Cited

U.S. PATENT DOCUMENTS

| | | | |
|---|---|---|---|
| 2007/0283996 A1* | 12/2007 | Hachtmann et al. ........... | 136/244 |
| 2011/0168238 A1* | 7/2011 | Metin et al. .................... | 136/251 |
| 2011/0271998 A1* | 11/2011 | Naitoh et al. .................. | 136/244 |
| 2012/0006378 A1* | 1/2012 | Kanto et al. ................... | 136/244 |

* cited by examiner

*Primary Examiner* — Jayne Mershon
(74) *Attorney, Agent, or Firm* — Marvin A. Motsenbocker; Mots Law, PLLC

(57) ABSTRACT

The present invention provides a solar cell module which keeps backing film from being scratched and prevents the occurrence of scratches. The solar cell module (10) of the present invention is provided with a surface protecting member (12), backing film (13), a plurality of solar cells (11) arranged between the surface protecting member (12) and the backing film (13) and electrically connected by means of wiring members (16), a filler material (14) for sealing the solar cells (11) between the surface protecting member (12) and the backing film (13), and transition wiring (20) electrically connected with the wiring members (16). Here, at least the end portion of transition wiring (20) positioned in a corner portion of the solar cell module is arranged so as to be positioned closer to the surface protecting member (12) than other portions of the transition wiring (20).

2 Claims, 5 Drawing Sheets

SOLAR CELL MODULE AND MANUFACTURING METHOD THEREFOR

CROSS-REFERENCE TO RELATED APPLICATIONS

This is a continuation of International Application PCT/JP2012/054416, with an international filing date of Feb. 23, 2012, filed by applicant, the disclosure of which is hereby incorporated by reference in its entirety.

FIELD OF THE INVENTION

The present invention relates to a solar cell module and a manufacturing method for the solar cell module.

BACKGROUND

A solar cell module has a structure in which a plurality of solar cells are connected in series or in parallel by means of a wiring member electrically connected to the terminals on the front and back surfaces of the cells.

Here, the electrodes in adjacent solar cells are connected by the wiring member. A solar cell string is constructed by connecting adjacent solar cells. A solar cell module is constructed by electrically joining a plurality of solar cell strings. The solar cell strings are electrically connected by soldering transition wiring between the wiring members positioned at the end portions of each solar cell string. The transition wiring is used as output wiring to draw out electric power from all of the solar cell strings. The transition wiring collects the power output from the wiring members, routes the power to the external output of the solar cell module, and is soldered to a conductor electrically joined to the external output.

A solar cell module is usually manufactured by stacking a surface protecting member, a filler material sheet, a plurality of solar cell strings, a filler material sheet and backing film in successive order, and then subjecting the laminate to heat and pressure inside a laminating device (see, for example, Patent Document 1).

PRIOR ART DOCUMENT

Patent Documents

Patent Document 1: Laid-Open Patent Application No. 2010-3861

SUMMARY

Problem Solved by the Invention

However, when the components are being laminated inside the laminating device, the backing film sometimes bends towards the surface protecting member, comes into contact with the end portion of the transition wiring, and becomes scratched. This decreases the production yield of solar cell modules.

It is an object of the present invention to provide a solar cell module with improved production yield.

Means of Solving the Problem

The present invention is a solar cell module provided with a surface protecting member, backing film, and a plurality of solar cell strings arranged between the surface protecting member and the backing film, and electrically connected by transition wiring. Here, at least the end portion of transition wiring positioned in a corner portion of the solar cell module is arranged so as to be positioned closer to the surface protecting member than other portions of the transition wiring.

The present invention is also a method for manufacturing a solar cell module having a plurality of solar cells arranged between a surface protecting member and backing film. This method includes a step of arranging in parallel solar cell strings containing a plurality of electrically connected solar cells, and electrically connecting the wiring members positioned at the end portions of adjacent strings using transition wiring. Here, at least one end portion of the transition wiring is bent, and the bent portion is oriented towards the surface protecting member and connected to the wiring member.

The present invention is also a method for manufacturing a solar cell module including the step of arranging on the stage inside a laminating device and then laminating a surface protecting member, a sealing sheet, a plurality of solar cell strings electrically connected by transition wiring, a sealing sheet, and backing film in successive order. This method also includes the step of bending at least one end portion of the transition wiring, orienting the bent portion towards the surface protecting member, arranging the solar cell strings on the stage, and laminating the module.

Effect of the Invention

Because at least the end portion of the transition wiring positioned in a corner portion of the solar cell module is arranged so as to be positioned closer to the surface protecting member than the other portions of the transition wiring, the present invention is able to provide a solar cell module with an improved production yield.

DETAILED DESCRIPTION

Figure 1:
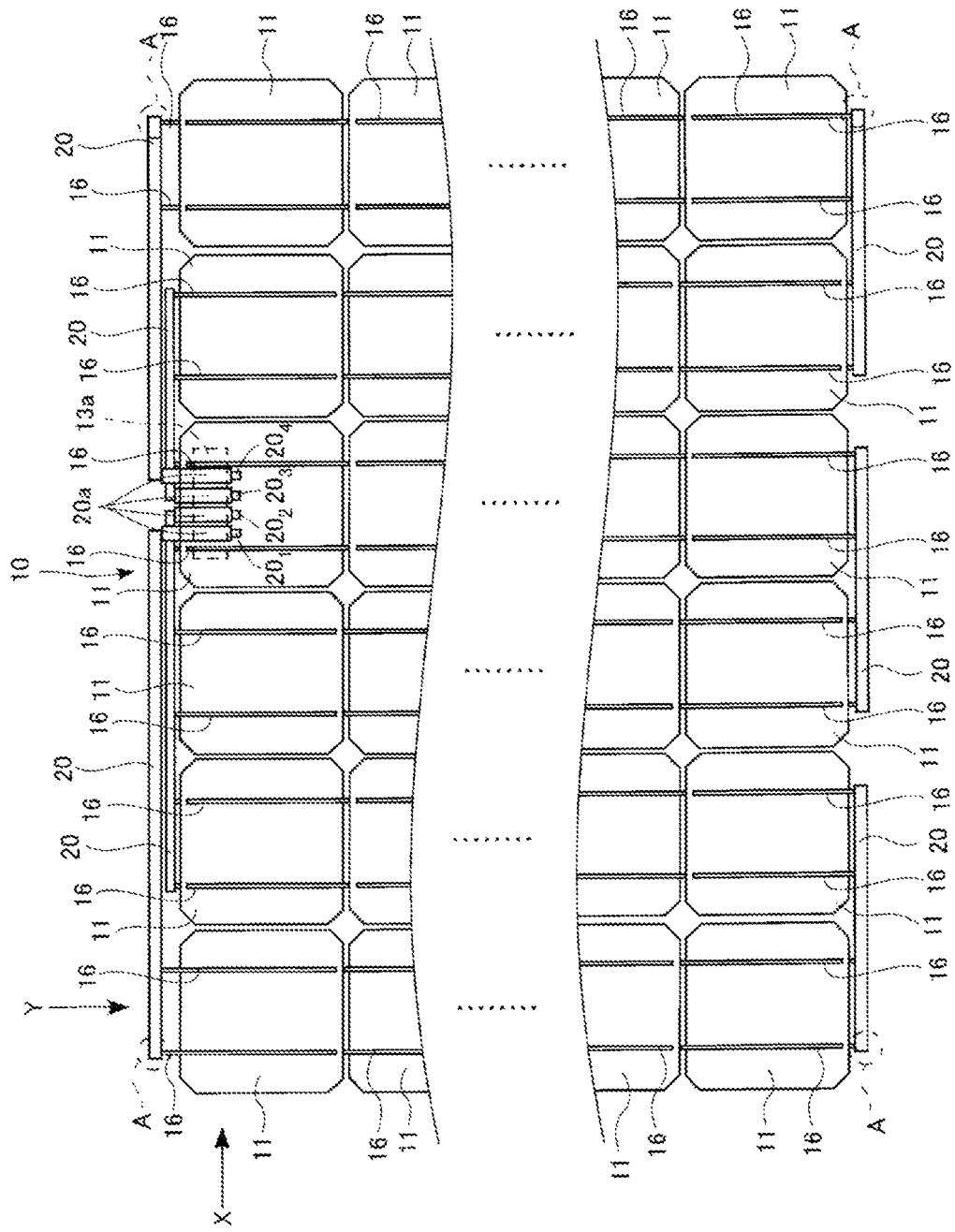
FIG. 1 is a plan view of a solar cell module according to an embodiment as viewed from the back side and centered on the transition wiring of the solar cell module.

The following is a detailed explanation of embodiments of the present invention with reference to the drawings. Further, in each of the drawings referenced in the embodiments, members having substantially the same function are denoted by the same symbols, and further explanation of these members has been omitted to avoid redundancy. The drawings referenced in the embodiments are also depicted schematically. The dimensional ratios of the objects depicted in the drawings may differ from those of the actual objects. The specific dimensional ratios of the objects should be determined with reference to the following explanation. The dimensional relationships and ratios of objects may also vary between drawings.

Figure 2:
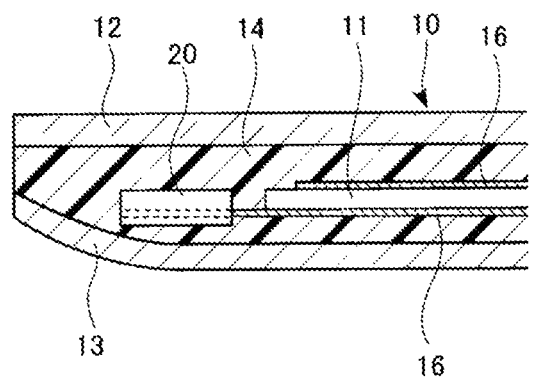
FIG. 2 is an enlarged cross-sectional view of a solar cell string positioned in the end portion of a solar cell module according to a first embodiment as viewed from direction X in FIG. 1.
Figure 3:
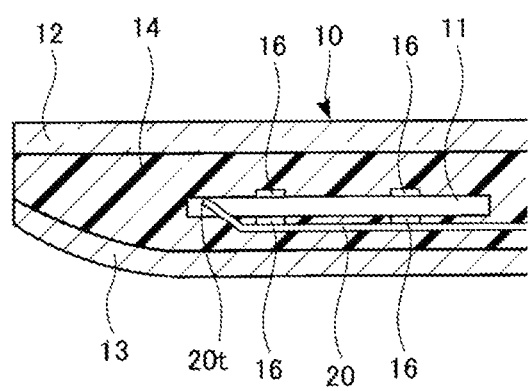
FIG. 3 is an enlarged cross-sectional view of a solar cell string positioned in the end portion of a solar cell module according to a first embodiment as viewed from direction Y in FIG. 1.
Figure 4:
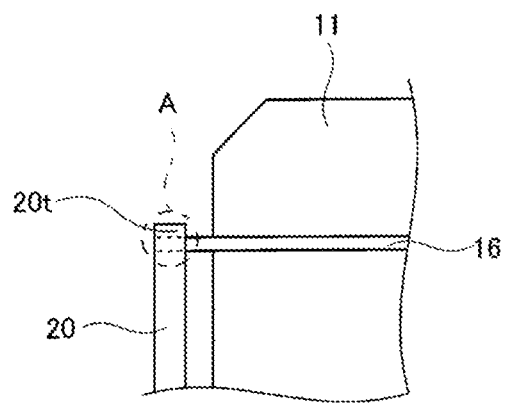
FIG. 4 is a plan view of the end portion of transition wiring of a solar cell module according to a first embodiment as viewed from the back side of the solar cell module.
Figure 5:
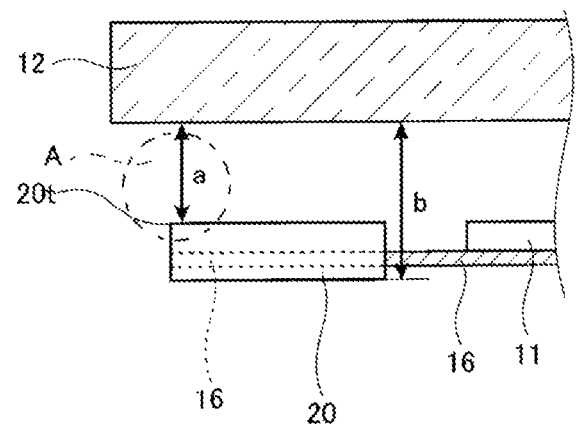
FIG. 5 is an enlarged schematic of the end portion of transition wiring of a solar cell module according to a first embodiment as viewed from direction X in FIG. 1.
Figure 6:
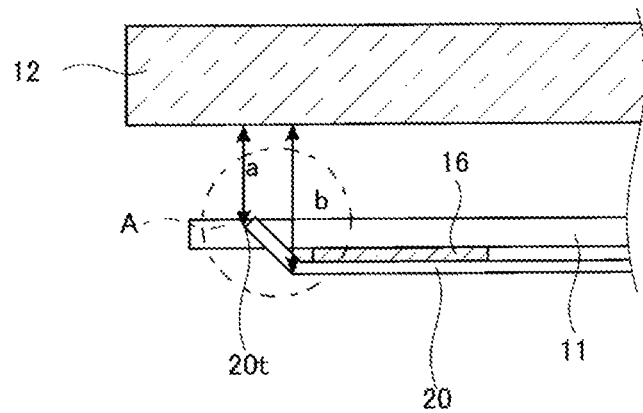
FIG. 6 is an enlarged schematic of the transition wiring of a solar cell module according to a first embodiment as viewed from direction Y in FIG. 1.

The following is an explanation of the configuration of a solar cell module 10 according to a first embodiment of the present invention with reference to FIG. 1 through FIG. 6. FIG. 1 is a plan view of a solar cell module as viewed from the back side and centered on the transition wiring of the solar cell module. FIG. 2 is an enlarged cross-sectional view of the transition wiring part of a solar cell string positioned in the end portion of a solar cell module according to a first embodiment as viewed from direction X in FIG. 1. FIG. 3 is an enlarged cross-sectional view of the end portion of the transition wiring part containing the transition wiring of a solar cell module according to a first embodiment as viewed from direction Y in FIG. 1. FIG. 4 is a plan view of the end portion of transition wiring of a solar cell module according to a first embodiment as viewed from the back side of the solar cell module. FIG. 5 is an enlarged schematic of the end portion of transition wiring of a solar cell module according to a first embodiment as viewed from direction X in FIG. 1. FIG. 6 is an enlarged schematic of the end portion of the transition wiring of a solar cell module according to a first embodiment as viewed from direction Y in FIG. 1.

The solar cell module 10 has solar cells 11, a surface protecting member 12, backing film 13, and filler material 14. The solar cell module 10 is constructed by sealing a plurality of solar cells 11 between the surface protecting member 12 and the backing film 13. The solar cells 11 are connected electrically to each other by means of wiring members 16.

The solar cells 11 may have an electrode on the light-receiving surface and the back surface. The solar cells 11 may be 100-mm square crystalline semiconductors with a thickness of 0.15 mm made of single-crystal silicon or polycrystalline silicon. However, the solar cells 11 in the present invention are not limited to this example. Other types of solar cells can be used.

Each solar cell 11 can have an n-type region and a p-type region, and a junction portion forming an electric field for separating carriers in the boundary portion between the n-type region and the p-type region.

The wiring member 16 connects the electrode arranged on the light-receiving surface of a solar cell 11 to the electrode arranged on the back surface of a solar cell 11 adjacent to this solar cell 11. The solar cells 11 are electrically connected in this way. The wiring member 16 may include laminate copper foil and solder plated on the surface of the copper foil.

When the wiring member 16 and a solar cell 11 are connected by solder, the solder plated on the surface of the wiring member 16 melts and connects the electrode of the solar cell 11. The solar cell 11 and the wiring member 16 can be connected using a resin adhesive instead of solder. Any resin adhesive with anisotropic conductivity can be used as the resin adhesive.

The surface protecting member 12 is arranged on the light-receiving surface of the filler material 14 to protect the surface of the solar cell module 10. The surface protecting member 12 may be transparent, moisture-resistant glass or a transparent plastic.

The backing film 13 is arranged on the back surface of the filler material 14 to protect the back side of the solar cell module 10. The backing film 13 can be resin film such as polyethylene terephthalate (PET) film, or a laminated film in which aluminum (Al) foil has been sandwiched between resin film. In the present embodiment, the backing film 13 is resin film such as PET.

The filler material 14 seals the solar cells 11 between the surface protecting member 12 and the backing film 13. The filler material 14 can be a polyolefin such as ethylene-vinyl acetate (EVA) copolymer resin, polyethylene or polypropylene, cyclic polyethylene, ionomers, polyacrylic acid polymers, copolymers of these, or a silicone resin such as polydimethylsiloxane. At the very least the filler material 14 arranged between the surface protecting member 12 and the solar cells 11 has to be a transparent filler material.

An opening 13a is provided in the backing film 13 to extract the transition wiring 20 for power output.

A terminal box (not shown) made of silicone resin is mounted on the surface of the backing film 13 so as to cover the opening 13a in the backing film 13. The transition wiring 20 leading from the opening 13a is connected to the terminals inside the terminal box, and an output cable (not shown) is connected to output the power.

There are four lines of transition wiring 20 leading from the opening 13a in this embodiment. Four terminals are provided on the terminal block of the terminal box, and the transition wiring $20_1$, $20_2$, $20_3$, $20_4$ is connected to each one. A blocking diode is connected between the terminals of the terminal box. An insulating material 20a is attached to the surface of the transition wiring $20_1$-$20_4$ to insulate the transition wiring 20.

A plurality of solar cells 11 arranged in one direction (the Y direction in the drawing) is connected electrically by wiring members 16 to construct a string. A plurality of strings is arranged in parallel in the direction perpendicular to this direction (the X direction in the drawing), and adjacent strings are connected electrically. In the present embodiment, as shown in FIG. 1, six strings are connected electrically in series. The transition wiring $20_1$ for the string on the far left is drawn from the opening 13a. The strings that are second and third from the left are connected by transition wiring $20_2$, and transition wiring $20_2$ is drawn from the opening 13a.

The transition wiring $20_4$ for the string on the far right is drawn from the opening 13a. The strings that are second and third from the right are connected by transition wiring $20_3$, and the transition wiring $20_3$ is drawn from the opening 13a.

In this way, the six strings are drawn from the opening 13a in the backing film 13 via the transition wiring $20_1$-$20_4$. These are connected to a predetermined terminal on the terminal box to complete the solar cell module.

An aluminum (Al) frame (not shown) can be mounted on the outer periphery of a solar cell module 10 with this configuration.

The wiring members 16 positioned at the end portion of each solar cell string is connected to the transition wiring 20 between solar cell strings. The transition wiring 20 is used as wiring to output the power generated by all of the solar cell strings. The transition wiring 20 drawn out of the module are connected to the terminals of the terminal box (not shown) to output electricity from the solar cells 11. The transition wiring 20 is usually copper foil with a thickness from 0.1 mm to 0.3 mm and a width of 6 mm whose entire surface has been coated with solder. This solder-coated foil is cut to a predetermined length and soldered to the wiring members 16.

In the present invention, a surface protecting member 12, a filler material sheet for the surface side, a plurality of solar cell strings 30, a filler material sheet for the back side, and backing film 13 is stacked in this order on the stage in a laminating device, and the laminate is subjected to heat and pressure to soften the filler material sheets. Any internal air bubbles are released, and the softened filler material evenly fills the area surrounding the solar cells 11 to seal the solar cells 11 between the surface protecting member 12 and the backing film 13.

The backing film 13 is flexible. During lamination, the filler material 14 flows near the end portion of the surface protecting material 12 and the backing film 13, the backing film 13 bends towards the surface protecting film 12, and the filler material 14 in the end portions of the solar cell module 10 becomes thinner. As a result, a corner portion of the transition wiring 20 positioned near the end portion of the solar cell module 10 sometimes passes through the filler material 14 on the back side and reaches the backing film 13. More specifically, the end portion of the transition wiring 20 at the four corners of the solar cell module 10 may come into contact with the backing film 13. In other words, the end portion of the transition wiring 20 in section A surrounded by the dotted lines in FIG. 1 may reach the backing film 13.

However, in the present embodiment, the transition wiring 20 is bent towards the surface protecting member 12 so that at least the tip portion 20t of the transition wiring 20 positioned in section A of FIG. 1 and FIG. 4 is positioned closer to the surface protecting member 12 than the other portions of the transition wiring.

As shown in FIG. 2, FIG. 3, FIG. 5 and FIG. 6, in the present embodiment, there is transition wiring 20 positioned near the backing film 13 and connected to the wiring members 16.

In the present embodiment, as shown in FIG. 2 and FIG. 3, the end portion of the transition wiring 20 is bent towards the surface protecting member 12, and the tip portion 20t is positioned closer to the surface protecting member 12 than the other portions. More specifically, the end portion of the transition wiring 20 in the array direction of the strings towards the outside of the module is positioned closer to the surface protecting member side than the other portions of the transition wiring. In the example shown in FIG. 4, the end portions of the transition wiring 20 positioned at the four corners of the solar cell module (see A in the drawing) are likely to make contact with the backing film 13. Therefore, as shown in FIG. 5 and FIG. 6, the end portion of the transition wiring 20 is bent towards the surface protecting member 12, and the tip portion 20t is positioned closer to the surface protecting member 12 than the other portion. In other words, as shown in FIG. 5 and FIG. 6, the tip portion 20t of the transition wiring 20 is bent towards the surface protecting member 12 and away from the backing film 13 so that the distance (a) between the tip portion 20t of the transition wiring 20 and the surface protecting member 12 is shorter than the distance (b) between the other portions of the transition wiring 20 and the surface protecting member 12.

A solar cell module 10 with this configuration is manufactured in a laminating device. A surface protecting member 12, an EVA sheet (filler material sheet) on the surface side, a plurality of solar cells 11 connected by means of wiring members 16, transition wiring 20, an EVA sheet (filler material sheet) on the back side, and backing film 13 are stacked in this order from top to bottom on the surface of the stage. At this time, the tip portion 20t of the transition wiring 20 is bent, the bent portion of the transition wiring 20 is directed towards the surface protecting member 12, and the solar cell strings are set on the stage.

After each configurational element has been placed inside the lamination device, the laminate is subjected to pressure and then heated from 130° C. to 200° C. The EVA sheets become gel, and form the predetermined EVA (filler material) layers 14. The solar cells 11 are interposed between the surface protecting film 12 on the surface side and the backing film 13 on the back side, and are sealed inside the EVA (filler material) layers 14.

The terminal box is mounted on the surface of the backing film 13 using silicone rubber to close the opening 13a in the backing film 13.

Because the tip portion 20t of the transition wiring 20 is bent towards the surface protecting member 12 when subjected to pressure in the lamination process, the corners of the transition wiring 20 are kept from coming into contact with the backing film 13, and any decline in reliability caused by this contact can be suppressed. As a result, solar cell modules can be provided with improved reliability and yield.

Figure 7:
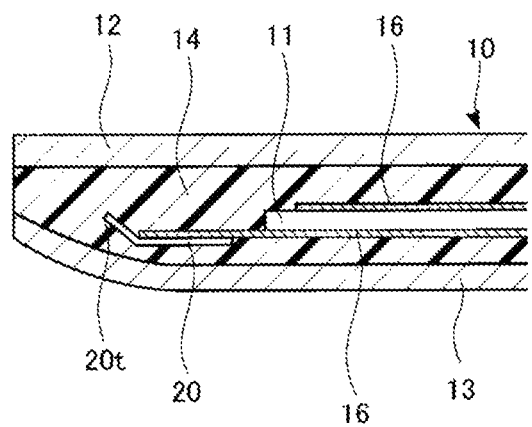
FIG. 7 is an enlarged cross-sectional view of the transition wiring of a solar cell module according to a second embodiment as viewed from direction X in FIG. 1.
Figure 8:
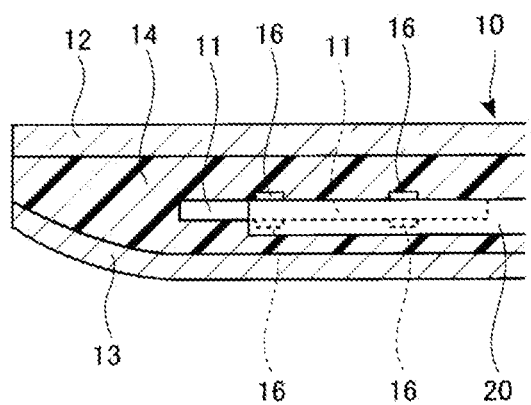
FIG. 8 is an enlarged cross-sectional view of the transition wiring of a solar cell module according to a second embodiment as viewed from direction Y in FIG. 1.
Figure 9:
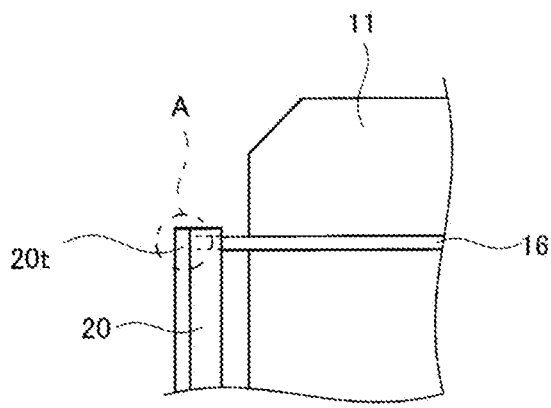
FIG. 9 is a plan view of the end portion of transition wiring of a solar cell module according to a second embodiment as viewed from the back side of the solar cell module.
Figure 10:
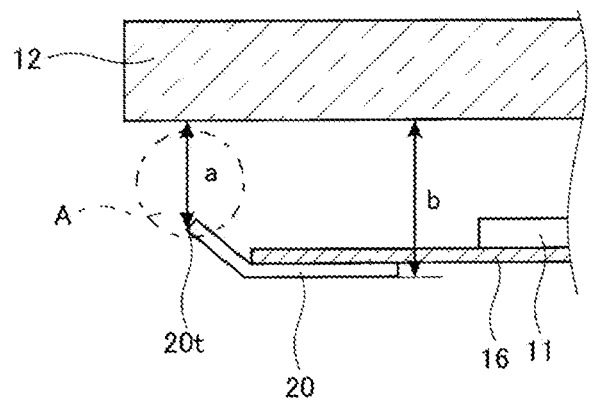
FIG. 10 is an enlarged cross-sectional view of the end portion of transition wiring of a solar cell module according to a second embodiment as viewed from direction X in FIG. 1.
Figure 11:
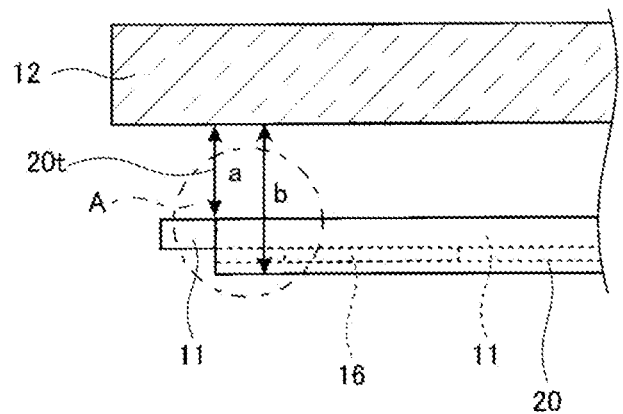
FIG. 11 is an enlarged schematic of the end portion of transition wiring of a solar cell module according to a second embodiment as viewed from direction Y in FIG. 1.

The following is an explanation of the configuration of a solar cell module 10 according to a second embodiment of the present invention with reference to FIG. 7 through FIG. 11. FIG. 7 is an enlarged cross-sectional view of the transition wiring of a solar cell module according to a second embodiment as viewed from direction X in FIG. 1. FIG. 8 is an enlarged cross-sectional view of the transition wiring of a solar cell module according to a second embodiment as viewed from direction Y in FIG. 1. FIG. 9 is a plan view of the end portion of transition wiring of a solar cell module according to a second embodiment as viewed from the back side of the solar cell module. FIG. 10 is an enlarged cross-sectional view of the end portion of transition wiring of a solar cell module according to a second embodiment as viewed from direction X in FIG. 1. FIG. 11 is an enlarged cross-sectional view of the end portion of transition wiring of a solar cell module according to a second embodiment as viewed from direction Y in FIG. 1. All components similar to those in the first embodiment are denoted by the same reference numbers, and further explanation of these components has been omitted in order to avoid redundancy.

As shown in FIG. 7 through FIG. 11, in the present embodiment, a portion of the transition wiring 20 is positioned near the backing film 13 and connected to the wiring members 16.

As shown in FIG. 9 and FIG. 14, the tips of the transition wiring 20 are all bent towards the surface protecting member 12, and the tips are positioned closer to the surface protecting member 12 than the other portions of the transition wiring. More specifically, the end portion of the transition wiring 20 running in the array direction of the solar cells 11 in a string towards the outer periphery of the module is positioned closer to the surface protecting member than the other portions of the transition wiring. In other words, the end portions of the transition wiring 20 positioned at the four corners of the solar cell module (see A in the drawing) are likely to make contact with the backing film 13. Therefore, as shown in FIG. 10 and FIG. 11, the end portion of the transition wiring 20 is bent towards the surface protecting member 12, and the tip portion 20t is positioned closer to the surface protecting member 12 than the other portion. As shown in FIG. 10 and FIG. 11, the tip portion 20t of the transition wiring 20 is bent towards the surface protecting member 12 and away from the backing film 13 so that the distance (a) between the tip portion 20t of the transition wiring 20 and the surface protecting member 12 is shorter than the distance (b) between the other portions of the transition wiring 20 and the surface protecting member 12.

Because the tip portion of the transition wiring 20 is bent towards the surface protecting member 12 when subjected to pressure in the lamination process, the corners of the transition wiring 20 are kept from coming into contact with the backing film 13, and any scratching caused by this contact can be suppressed. As a result, defects due to scratching can be reduced significantly.

Figure 12:
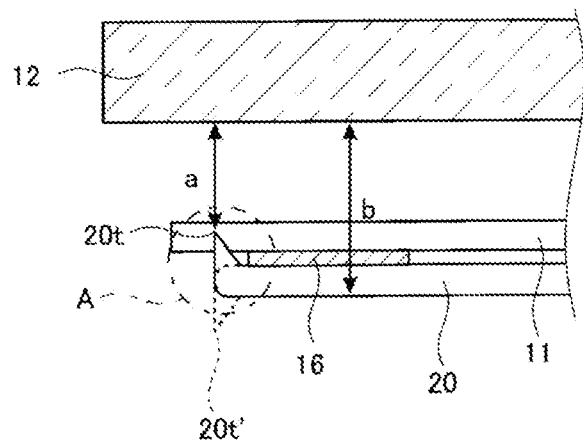
FIG. 12 is an enlarged schematic of the connection between the transition wiring and a wiring member according to a third embodiment of the present invention.

If the distance (a) between the tip portion 20t of the transition wiring 20 and the surface protecting member 12 is shorter than the distance (b) between the other portions of the transition wiring 20 and the surface protecting member 12, the tip portion 20t of the transition wiring 20 is kept away from the backing film 13, and contact between the tip portion of the transition wiring 20 and the backing film 13 after lamination can be prevented. In the third embodiment shown in FIG. 12, when the tip portion 20t' of the transition wiring 20 protrudes at an acute angle, the protruding tip portion 20t is arranged so as to be positioned closer to the surface protecting member 12. As indicated by the dotted lines in FIG. 12, when a protruding tip portion 20t' faces the backing film 13, the distance to the backing film 13 is reduced, and the protruding tip portion 20t' may come into contact with the backing film 13 after lamination. When the tip portion 20t of the transition wiring 20 protrudes at an acute angle but the protruding portion 20t is positioned closer to the surface protecting member 12, the protruding portion 20t of the transition wiring 20 is kept from coming into contact with the backing film 13, and any decline in reliability due to this contact can be suppressed.

Figure 13:
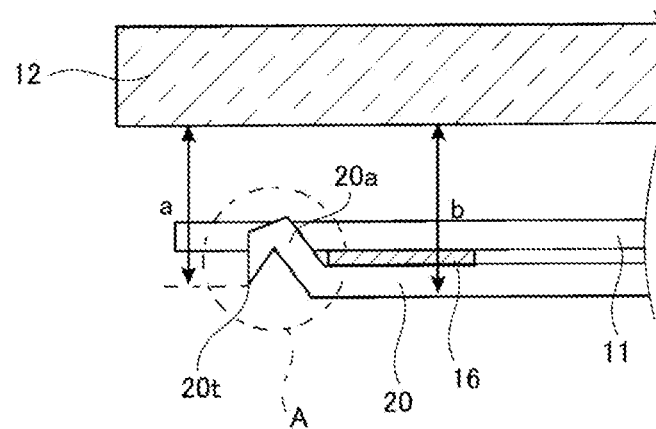
FIG. 13 is an enlarged schematic of the connection between the transition wiring and a wiring member according to a fourth embodiment of the present invention.

In the fourth embodiment shown in FIG. 13, the tip portion 20t of the transition wiring is oriented on the backing film 13 side but the tip portion 20a is bent towards the surface protecting member 12. The tip portion 20t of the transition wiring 20 is bent towards the surface protecting member 12 and away from the backing film 13 so that the distance (a) between the tip portion 20t' of the transition wiring 20 and the surface protecting member 12 is shorter than the distance (b) between the other portions of the transition wiring 20 and the surface protecting member 12.

Because the tip portion of the transition wiring 20 is bent towards the surface protecting member 12 when subjected to pressure in the lamination process, the tip portion 20t of the transition wiring 20 is kept from coming into contact with the backing film 13, and any decline in reliability caused by this contact can be suppressed. As a result, solar cell modules can be provided with improved reliability and yield.

The embodiments described above are for illustrative purposes only and do not impose limitations on the present invention. The scope of the present invention is defined by the scope of the claims and not by the description of the embodiments, and includes everything equivalent in meaning to the scope of the claims and all modifications therein.

KEY TO THE DRAWINGS

10: Solar cell module
11: Solar cell
12: Surface protecting member
13: Backing film
13a: Opening
14: Filler material
16: Wiring member
20: Transition wiring

What is claimed is:

1. A solar cell module comprising:
a surface protecting member,
backing film, and
a plurality of solar cell strings arranged between the surface protecting member and the backing film, and electrically connected by transition wiring; wherein
each of the solar cell strings comprises: solar cells and a wiring member electrically connecting the solar cells,
each transition wiring includes a soldering connection area where the transition wiring is connected to the wiring member with solder,
an end portion, outside of the soldering connection area, of transition wiring positioned in a corner portion of the solar cell module is positioned closer to the surface protecting member than other portions of the transition wiring,
the end portion, outside of the solder connection area, of the transition wiring positioned in the corner portion of the solar cell module being positioned closer to the surface protecting member than other portions of the transition wiring is not in contact with and does not penetrate through the surface protecting member.

2. The solar cell module according to claim 1, wherein the transition wiring is bent towards the surface protecting member so as to position the end portion of the transition wiring closer to the surface protecting member side than the other portions of the transition wiring.

* * * * *